United States Patent [19]
Ottesen

[11] Patent Number: 5,463,758
[45] Date of Patent: Oct. 31, 1995

[54] SYSTEM AND METHOD FOR REDUCING SEEK TIME FOR READ OPERATIONS IN MIRRORED DASD FILES

[75] Inventor: Hal H. Ottesen, Rochester, Minn.

[73] Assignee: International Business Machines Corporation, Armonk, N.Y.

[21] Appl. No.: 101,138

[22] Filed: Aug. 2, 1993

[51] Int. Cl.⁶ ............................. G06F 11/16; G06F 13/00
[52] U.S. Cl. ....................... 395/441; 395/404; 360/78.04
[58] Field of Search ..................................... 395/425, 400; 360/75, 78.04

[56] References Cited

U.S. PATENT DOCUMENTS

| | | | |
|---|---|---|---|
| 4,138,741 | 2/1979 | Hedlund et al. | 369/33 |
| 4,383,279 | 5/1983 | Kenney, II | 358/341 |
| 4,796,098 | 1/1989 | Giddings | 358/342 |
| 4,920,528 | 4/1990 | Sakamoto et al. | 369/54 |
| 5,083,229 | 1/1992 | Frey, Jr. | 360/78.04 |
| 5,390,313 | 2/1995 | Yanai et al. | 364/DIG. 2 |

FOREIGN PATENT DOCUMENTS 0426483  8/1991  European Pat. Off. .

OTHER PUBLICATIONS

"Skewed Format Method For Personal Computer Hard Disks To Reduce Rotational Latency Delays", IBM Technical Disclosure Bulletin, vol. 29, No. 4, New York, U.S., Sep., 1986, pp. 1867–1868.

"Latency Reduction For CD-ROM And CLV Disks", IBM Technical Disclosure Bulletin, vol. 34, No. 7B, New York, U.S., Dec., 1991, pp. 19–20.

Database WPIL, No. 89-030 155, Derwent Publications Ltd., London; & RD-A-296047 (Anonymous), Oct. 12, 1988. *Abstract*.

*Primary Examiner*—David L. Robertson
*Attorney, Agent, or Firm*—Andrew J. Dillon

[57] ABSTRACT

Disclosed is a mass storage system for a data processing system providing data redundancy by mirroring files and arranging redundant record copies in a way to reduce access time and energy consumption over a pure mirrored system. A plurality of mirrored disk drives for long term storage of duplicate copies of the records are utilized. The logical address for each record is equated to relatively displaced radial locations among the mirrored disk drives. A controller for the mirrored disk drives maintains a record of correspondence between track physical addresses and logical addresses, and the current location for the transducer positioning arm for each disk drive. Upon a read access to a record, the arm closest, in terms of track displacement, from the track where a record copy is kept is used to access the record copy. Application of the method to zone bit recording system is also discussed.

18 Claims, 8 Drawing Sheets

| PHYSICAL TRACK | FILE 0 (DRIVE 74) RECORD / LOGICAL TRACK | FILE 1 (DRIVE 75) RECORD / LOGICAL TRACK |
|---|---|---|
| 0 | 0 | 500 |
| 1 | 1 | 501 |
| 2 | 2 | 502 |
| ⋮ | ⋮ | ⋮ |
| 100 | $A_0$ \| 100 | |
| 101 | 101 | |
| ⋮ | | $B_1$ \| 800 |
| 300 | | 801 |
| ⋮ | | ⋮ |
| 499 | 499 | 998 |
| 500 | 500 | 999 |
| 501 | 501 | 0 |
| ⋮ | ⋮ | ⋮ |
| 600 | | |
| ⋮ | | $A_1$ \| 700 |
| 800 | $B_0$ \| 800 | |
| 801 | 801 | |
| ⋮ | ⋮ | ⋮ |
| 998 | 998 | 498 |
| 999 | 999 | 499 |
|  | ~200 | ~202 |

*Fig. 6*

| PHYSICAL TRACK | FILE 0 (DASD 0) RECORD TRACK | FILE 1 (DASD 1) RECORD TRACK | FILE 2 (DASD 2) RECORD TRACK |
|---|---|---|---|
| 0 | 0 | 333 | 667 |
| 1 | 1 | 334 | 668 |
| 2 | 2 | 335 | 669 |
| ... | | | |
| 167 | | $A_1$ 500 | |
| ... | | | |
| 332 | 332 | 665 | 999 |
| 333 | 333 | 667 | 0 |
| ... | | | |
| 500 | $A_0$ 500 | | |
| ... | | | |
| 666 | 666 | 999 | 332 |
| 667 | 667 | 0 | 333 |
| ... | | | |
| 834 | | | $A_2$ 500 |
| ... | | | |
| 998 | 998 | 331 | 665 |
| 999 | 999 | 332 | 666 |
|  | ⌡210 | ⌡212 | ⌡214 |

*Fig. 7*

SYSTEM AND METHOD FOR REDUCING SEEK TIME FOR READ OPERATIONS IN MIRRORED DASD FILES

BACKGROUND OF THE INVENTION

1. Technical Field

This invention relates to direct access storage devices (DASD) and more particularly to a system and method for reducing read access time to data which have been duplicated to two or more DASD units.

2. Description of the Related Art

A direct access storage device is an information storage device in which access time to data is essentially independent of the location of the data. The characteristic of independence in access time to data distinguishes direct access storage devices from serial storage devices such as tape drives. Disk drives of various types are the most common direct access storage devices.

A disk drive is a data storage device which utilizes at least one rotatable magnetic disk (or platter). The data are represented on the disk as a series a physical transformations of a recording media, such as magnetically polarized regions of a magnetic material. The physically transformed regions are arrayed along the surface of the disk along either a plurality of concentric data tracks or spiral data tracks.

A transducer reads data from a disk by producing an electrical signal in response to encountering the physically transformed regions. Data is written by using an electrical signal to control formation of the physically transformed regions along the various tracks on the disk while the disk moves underneath the transducer. In magnetic systems, the transducer forms a portion of a body called a slider. The slider flies just off the surface of a rotating disk. The slider is attached on its backside to a suspension system which in turn is connected to an actuator arm. The actuator arm is used to selectively position the head over one particular desired track during a read or write operation. As the disk is spun the magnetically polarized regions pass by the head one after another. The slider itself may be moved radially or on an arc inward or outward to change the track over which the slider is positioned.

While disk drive reliability has improved over the last few years, the devices are nonetheless electro-mechanical and liable to failure. These failures may be caused by a circuit defect which affects the readback function, in which case no data has been lost. Data may be recovered by repair of the circuitry to gain access to the data. If the failure occurs at an inconvenient time, the delay in recovery may be very expensive to user. If the failure occurs in the write circuitry or on the medium itself, then the data are permanently lost. If the failure is a so called head crash where a head strikes and destroys a portion of a medium surface, then data are permanently lost too.

The various causes listed above are characterized by the fact that generally only one DASD unit of a group in a system is affected at a time. Reliability in data access may be improved by use of more than one DASD unit to store redundant data. One redundancy scheme is called disk mirroring or disk duplexing. In mirroring, a record is stored on each of two or more DASD units. Each copy of a record is complete. Thus, in effect, two or more physical addresses (one for each drive) are provided for each logical address associated with the record.

SUMMARY OF THE INVENTION

It is an object of the present invention to provide a system and method for improving read access times and reducing power consumption in disk mirroring data storage systems.

Other objects, features and advantages will be apparent in the written description of the invention that follows. A secondary data storage system for a host computer system includes a plurality of disk drive systems. Data redundancy is provided by mirroring records on the disk drives. Time and energy expended in access of a record is reduced over a prior art mirroring system by selection of a particular copy for access with a read operation. The redundant record copies are located on the disk drives to make one copy of the record closest for access. The logical address for each record is mapped to tracks on the various drives which differ in radial displacement from the axis of rotation for each disk drive. A controller for the mirrored disk drives maintains the map between track physical addresses and logical addresses, and tracks the current location for the transducer positioning arm, for each disk drive. Upon a read access to a record, the arm closest, in terms of track displacement, to the track where a record copy is kept, is used to access the record copy.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 6 is a map of physical locations to logical addresses for two mirrored disk drives;

FIG. 7 is a map of physical locations to logical addresses for three mirrored disk drives.

These drawings are not intended as a definition of the invention but are provided solely for the purpose of illustrating one of the preferred embodiments of the invention described below.

DETAILED DESCRIPTION OF THE INVENTION

Figure 1:
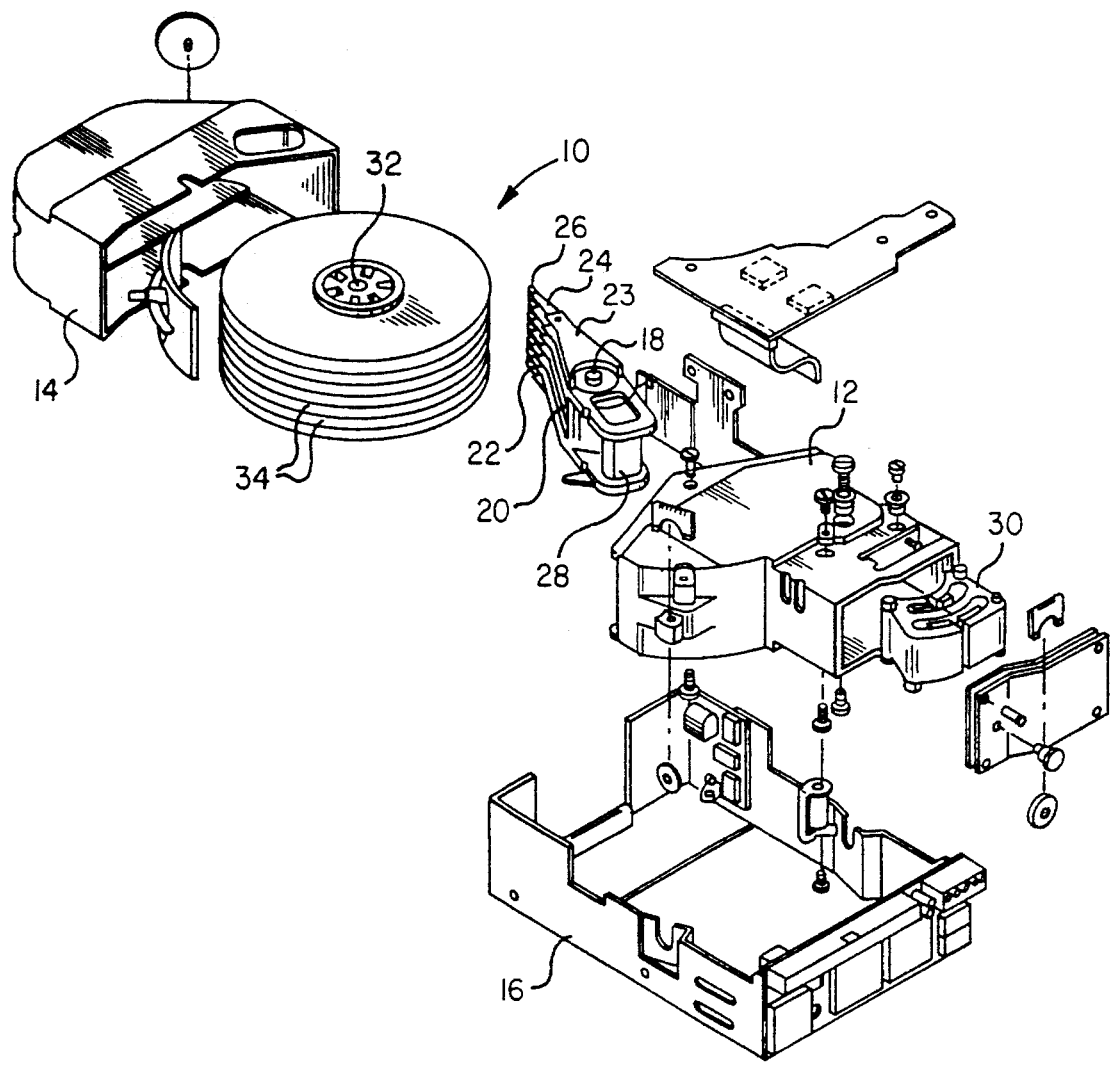
FIG. 1 is an exploded view in perspective of a disk drive from the prior art.

FIG. 1 is an exploded view of a disk drive 10. It should be noted that although a rotary actuator is shown, the invention described herein is also applicable to linear actuators. The disk drive 10 includes a housing 12, and a housing cover 14 which, after assembly, is mounted within a frame 16. Rotatably attached within the housing 12 on an actuator shaft 18 is an actuator arm assembly 20. One end of the actuator arm assembly 20 includes an E block or comb like structure 22 having a plurality of arms 23. Attached to the separate arms 23 on the comb or E block 22, are load springs 24. In this case, the load springs form the suspension. Attached at the end of each load spring is a slider 26 which carries a pair of magnetic transducers or the head. The transducers may be of an inductive type, or may include a read transducer of a magnetoresistive type. On the other end of the actuator arm assembly 20 opposite the load springs 24 and the sliders 26 is a voice coil 28.

Attached within the housing 12 is a pair of magnets 30. The pair of magnets 30 and the voice coil 28 are key parts of a voice coil motor which applies a force to the actuator arm assembly 20 to rotate it about the actuator shaft 18. Also mounted within the housing 12 is a spindle shaft 32. Rotatably attached to the spindle shaft 32 are a number of disks 34. In the drive shown, eight disks are attached to the spindle shaft 32 although a fewer or greater number may be used. The disks 34 are attached to the spindle shaft 32 in spaced apart relation. An internal motor (not shown) rotates the disks 34.

Figure 2:
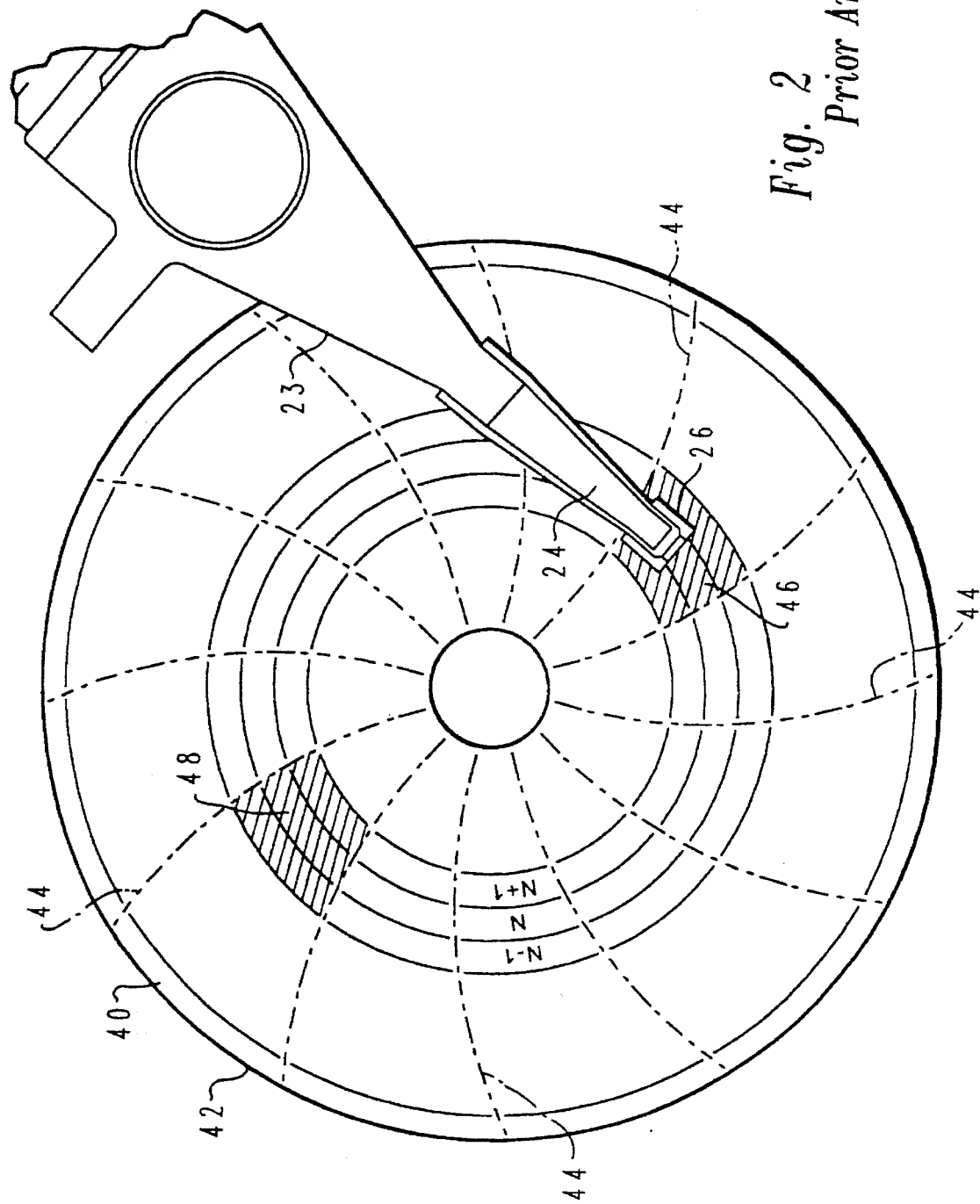
FIG. 2 is a view in top plan of a disk drive illustrating locations of tracks to which data records can be written.

FIG. 2 illustrates positioning of slider 26 by an arm 23 over one of a plurality of tracks (1 to N+1) on a magnetic surface 40 of a disk 42. Each track is divided into segments or sectors by a plurality of track servo fields 44 extending radially from the center of disk 40. Track servo fields curve to conform to the travel of slider 26 at the end of rotatable arm 23. If disk rotational speed is constant (i e., "constant angular velocity" or "CAV"), and data is stored and read at a constant data rate, a transducer mounted to slider 26 encounters a track servo field 44 at strict intervals of times. If a linearly actuated armature is used, track servo fields 44 are straight. Tracking information is derived from servo fields 44 in a manner well known in the art. Slider 26 is shown following track N, positioned over a segment 46. Typically, all transducers used with a stack of platters move together. Vertically aligned tracks may form a cylinder in this arrangement with data for a record being interleaved among the platters.

Figure 3:
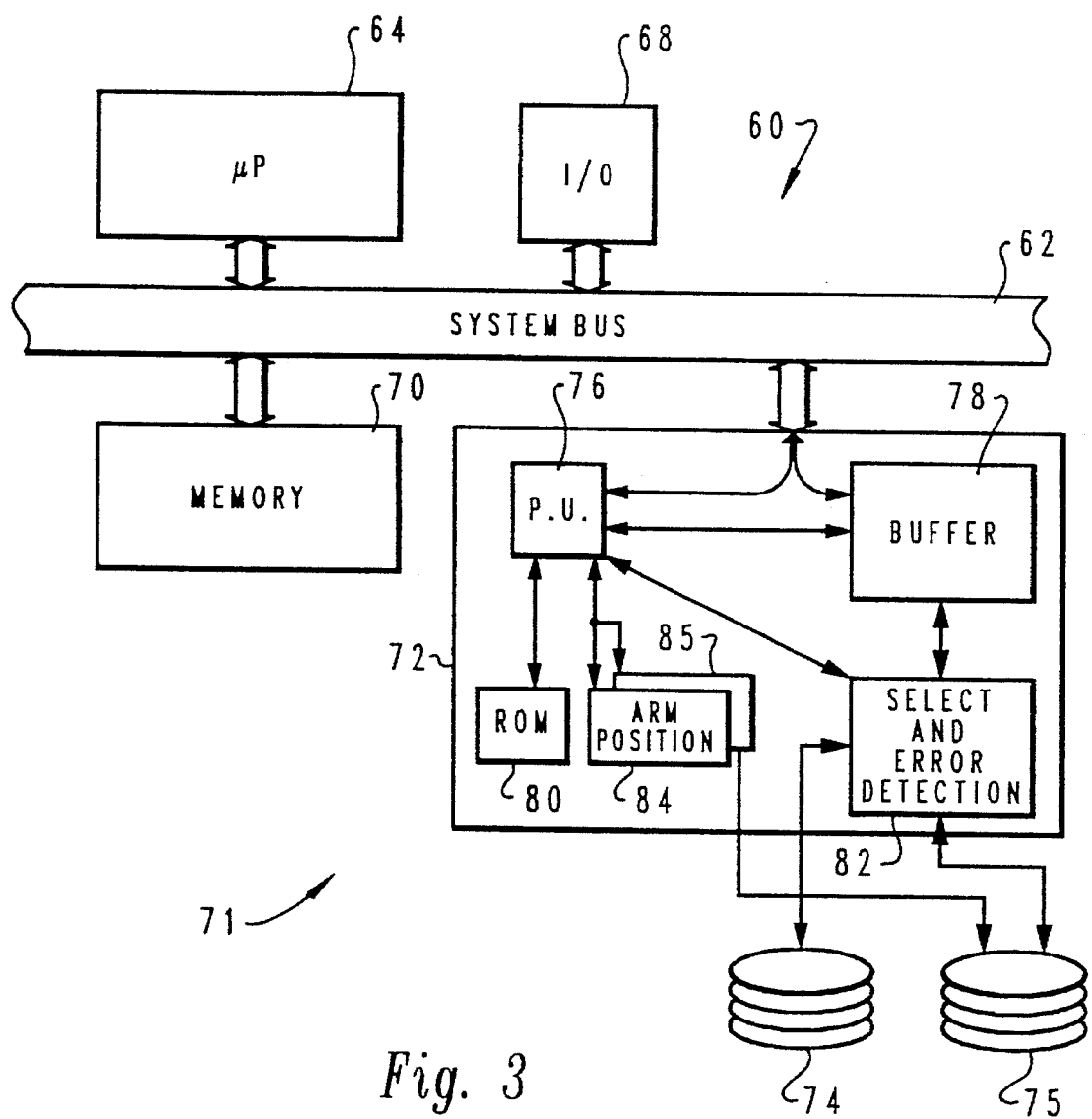
FIG. 3 is a block diagram of a digital computer system and disk drive controller.

FIG. 3 depicts a block diagram of a computer system 60. Computer system 60 includes a plurality of devices communicating over a system bus 62. Bus 62 includes a data bus and a control bus. Chief among components which may be attached to the system bus are a microprocessor 64, an input/output (I/O) device 68, a memory 70 and a secondary storage device 71. Secondary storage device 71 includes a device controller 72 and at least first and second disk drives 74 and 75. A data record is physically represented on both disk drive 74 and disk drive 75.

Device controller 72 handles the interface for data transfer between disk drives 74 and 75 and the devices on system bus 62. Device controller 72 includes buffer 78 for temporarily holding data in transit between memory 70 onto disk drives 74 and 75, or from disk drive 74 or 75, and devices attached to system bus 62. Processor unit 76 may be initialized upon system power up, or it may have access to a small read only memory (ROM) 80 providing programming for controlling processor unit 76 operation. Interposed between disk drives 74 and 75 and buffer 78 is a select and error detection apparatus 82 which may be used to generate parity codes for data items as written to drives 74 and 75 and then to do parity checks upon read back of data form disk drive 74 or 75. An error indication on read back is transmitted from select and error detection apparatus 82 to processing unit 76.

Buffer 78 is controlled by processor unit 76. Processing unit 76 also determines physical addresses for records from logical addresses received over system bus 62 from a device requesting access to the record or transferring an update to a record. A table relating logical to physical addresses may be maintained in buffer 78. The position of the arms for disk drives 74 and 75, in terms of the last track accessed, is kept in reserved portions of buffer 78.

Arm positioning units 84 and 85 for disk drives 74 and 75 receive position command information derived from comparison of the logical address for a record and the actual physical location of the record copy on a selected disk drive 74 and 75. A position error signal is also decoded from servo information stored on the selected disk and decoded for an arm positioning unit 84 and 85. The position command information and position error signal are combined to generate actuation signals applied to move the arms of the respective disk drives in a manner well known in the art.

Figure 4:
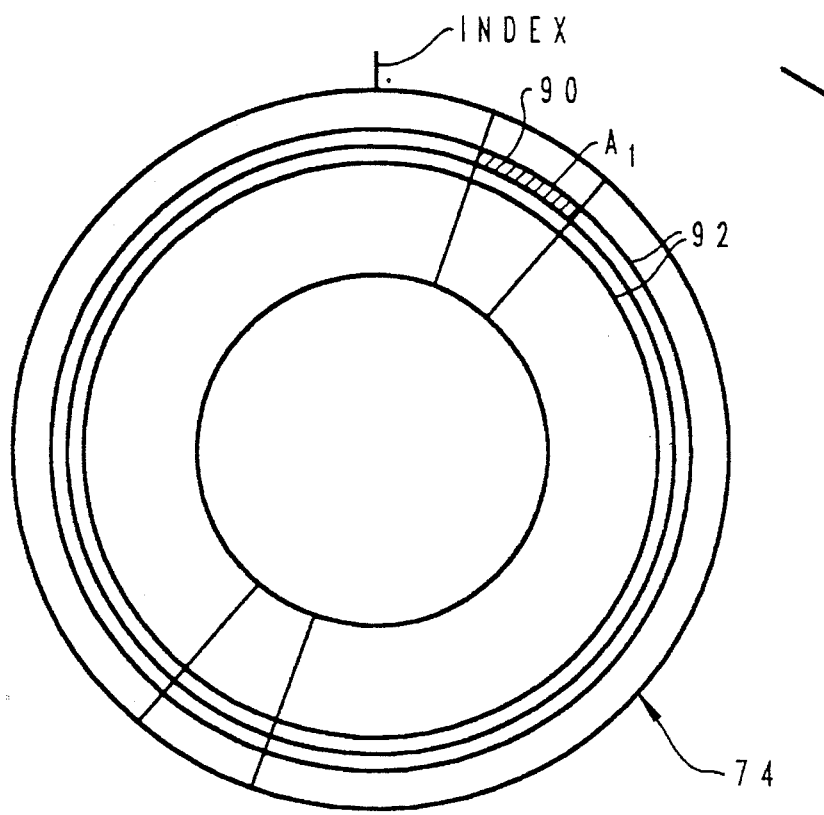
FIG. 4 is a view of the arrangement of tracks for two disk drives.
Figure 4:
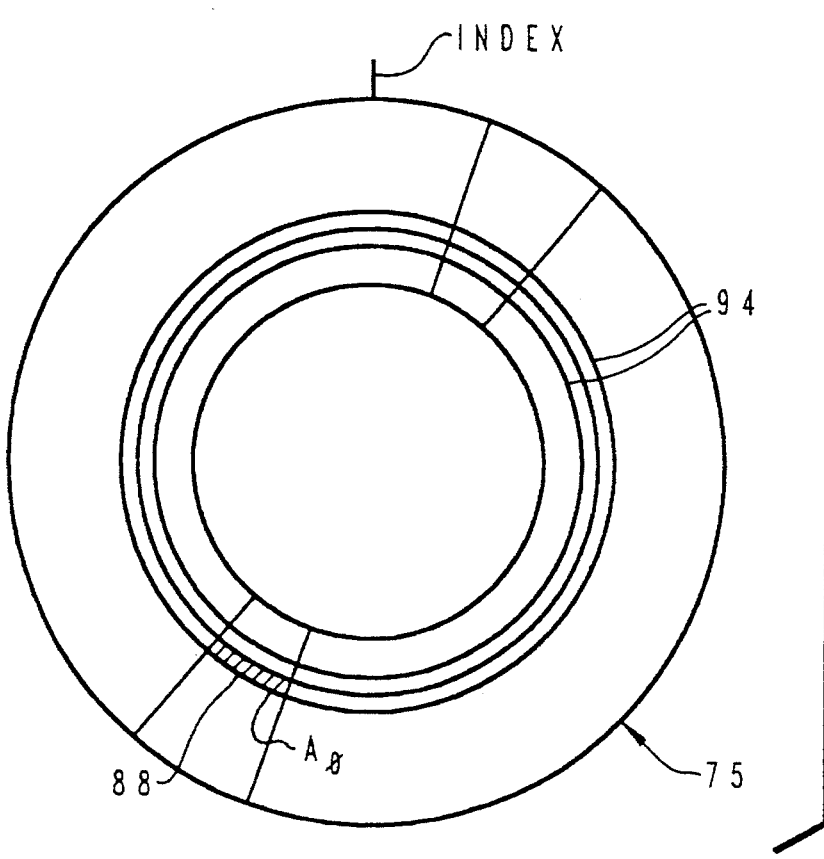

FIG. 4 illustrates the disposition of tracks and an exemplary record A on disk drives 74 and 75. A single logical record A is stored as two physical copies $A_0$ and $A_1$. Copies $A_0$ and $A_1$ are stored (i.e. mirrored) in physical locations 88 and 90 on tracks 92 and 94, respectively. Although disk drives 74 and 75 are physically equivalent units, and tracks 92 and 94 logically correspond to one another, the tracks are at different radial displacements from their respective axes of rotation. Similarly, locations 88 and 90 are circumferentially opposed, but logically correspond. Such circumferential spacing is not required by the invention but will make a similar contribution to read operation performance as does differential radial disposition. An index mark allows counting of sectors and synchronization of disk drives 74 and 75.

Figure 5:
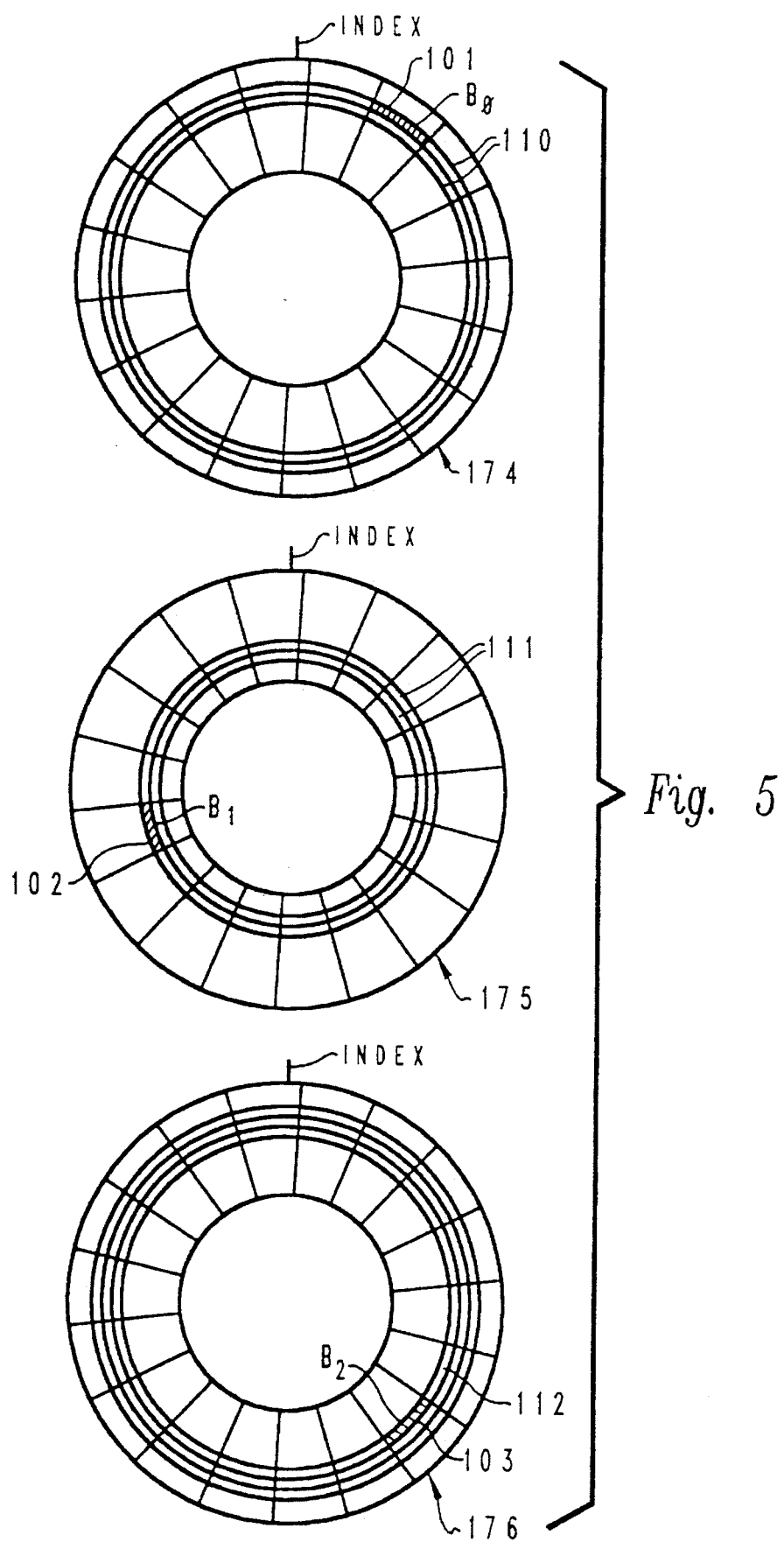
FIG. 5 is a view of the arrangement of tracks for three disk drives.

FIG. 5 illustrates the disposition of tracks and an exemplary record B on disk drives 174, 175 and 176. A single logical record B is stored as three physical copies $B_0$, $B_1$ and $B_2$. Copies $B_0$, $B_1$ and $B_2$ are mirrored in physical locations 101, 102 and 103 on tracks 110, 112 and 113, respectively. Tracks 110, 112 and 113 are differentially spaced from the respective axes of rotation for disk drives 101, 102 and 103, but logically correspond to one another. Similarly for synchronized drives, locations 101, 102 and 103 may be circumferentially differentiated.

FIG. 6 maps physical tracks on disk drives 74 and 75 by maps 200 and 201 to logical tracks. When a record is written, its logical address is compared to maps 200 and 201 to find the physical track on the disk drives for the records. For example, if disk drive 74 has 1000 tracks or cylinders (numbered 0 to 999), logical numbering of tracks begins with 0 on the outermost track and increases sequentially until concluding with number 999 for the innermost track. Logical numbering for tracks on drive 75 then begins with 500 and increases sequentially until about the center useable track is reached, which is numbered 999. The next track moving inwardly is numbered 0 and track numbering continues to increase sequentially up to 499 for the innermost track. Thus a given physical track on the outer half of drive 74 will correspond logically to a physical track on the inner half of drive 75 and vice versa.

The relative positions for copies of two records A and B are illustrated. Record A has a logical address of track 100, which corresponds to the 100th and 600th physical tracks, respectively, on the two drives. Record B has a logical address of track 800, which corresponds to the 800th and 300th physical tracks, respectively.

The improved performance resulting from the radially differentiated disposition of logical tracks stems from a possible reduction in the physical track to track seek distance that may occur when two drives use different dispositions for logical tracks. Any alteration of logical track disposition between disk drives, where two or more drives are used, can result in an improvement in access time for any given operation.

Utilizing the bifurcated mapping of the preferred embodiment for two mirrored drives, and assuming the arms begin the operations over the corresponding logical tracks, the maximum seek distance for a read operation is ½ the total number of tracks instead of all of the tracks as in single disk drive operation. When the drives are coming off a write operation the arms for two devices are over the same logical track. The physical position of the arms differs with respect to their respective axes of rotations by one half the number of physical tracks on the disk drives. When a read operation directly precedes a read operation, the initial positions of the arms may be considered randomized. When the initial position of the arms is randomized, the maximum possible seek distance for the two drive case is ¾ of the total number of tracks (e.g., a seek to logical track 750 where the initial arm position for drive 74 is over logical track 0 and for drive 75 is over logical track 499). In modelling the two drive embodiment, seek distances of greater than 500 tracks were not observed over 20,000 connective seek operations begun synchronized at physical track 0 for each drive. The seek distance, for a given operation, cannot increase over the single drive situation.

Circumstances involving certain sequences of seek operations are conceivable where overall seek time would increase for the operations collectively. However, simulations show that, on average, performance is improved. The sequences which give rise to reduced performance involve consecutive seeks to sequentially adjacent tracks. An example of such a situation is a sequence of accesses involving a read of logical track 499 followed by a read of logical track 500. The first seek may be given to the arm of drive 75 and the second seek may then be given to the arm of drive 74, because logical tracks 499 and 500 are radially displaced by 1000 track locations on drive 75. Under these circumstances it is possible that giving both seeks to drive 74 may have been more efficient. Where processing unit 76 can buffer requests it may be possible to optimize read operations over a sequence of read operations.

FIG. 7 illustrates a mapping of logical tracks in a trifurcated pattern to physical tracks of three disk drives. For a DASD 0, the logical tracks correspond to the same physical tracks as illustrated by table 210. For a DASD 1, physical tracks 0 to 332 correspond to logical tracks 333 to 666, physical tracks 333 to 666 correspond to logical tracks 667 to 999, and physical tracks 667 to 999 correspond to logical tracks 0 to 332, as shown by map 212. For DASD 2, physical tracks 0 to 332 correspond to logical tracks 667 to 999, physical tracks 333 to 666 correspond to logical tracks 0 to 332, and physical tracks 667 to 999 correspond to logical tracks 333 to 666, as shown by map 214. A record A, having a logical address of track 500, is located on physical tracks 500, 834 and 167 on the three drives. Calculating physical locations is in effect a modulo addition.

The disk drives discussed so far have one data field per data sector positioned between each track servo field. The servo fields function as data sector boundaries. Where zone bit recording is used data is in effect compacted to place the maximum number of bits on each track. A data field may then straddle parts of more than one data sector and thus more than one data field may be positioned between a pair of servo fields. Use of zone bit recording greatly complicates use of the present invention because the quantity of data now possible to store on an outer track will no longer fit on a single inner track. However, assigning like quantities of data to groups called zones and radially reposition zones from drive to drive make application of the invention possible.

Figure 8:
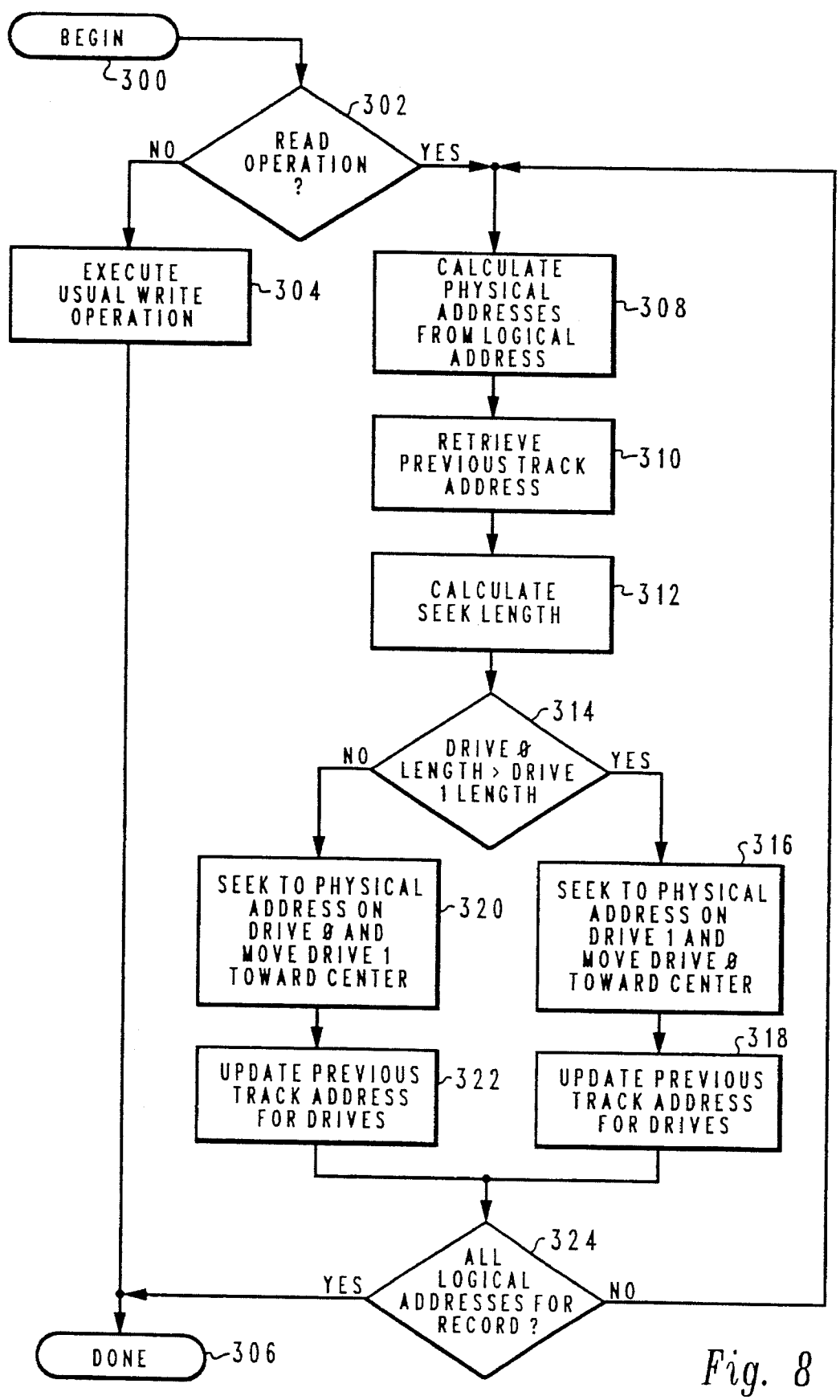
FIG. 8 is a logical flow chart of a process for implementing the present invention on a digital computer system on a two disk drive system.

FIG. 8 is a flow chart of a process for practicing the method of the invention. The process illustrates application of the invention to two mirrored disk drives. The process is entered at step 300 upon receipt by processing unit 76 of an access request to disk data storage system 71. Step 302 is then executed to determine if the access request is a read operation. Write operations must be carried out on all disk drives, therefore all arms must be moved to the correct drive tracks for a write operation. If the operation is not a read operation, the NO branch is followed from step 302 to step 304, where execution of a write operation is provided for. While write operations may be more time consuming compared with conventional mirroring systems as a result of use of the invention, read operations usually outnumber write operations by 4 or 5 to 1. Overall, system performance is then improved. Once the write operation is completed the process is exited at step 306.

If at step 302 it is determined that a read operation is to be done, the YES decision branch is followed to step 308. At step 308 the physical addresses corresponding to the logical address received with the access request are determined. Next, at step 310, the current track positions for the various disk drive arms are retrieved. At step 312 the physical addresses and the previous track positions are compared to generate distances that each arm would need to move to reach the physical track on its drive where the data is stored. At step 314, the distances generated in step 312 are compared to locate the shortest instance. For a two drive system this comparison produces a YES decision if the seek distance for the arm of Drive 1 is shorter, and a NO decision if the seek distance for the arm of drive 0 is as short or shorter than the distance for the arm of drive 1. For three are more disk drives, step 314 would involve additional comparison.

Following the NO branch from decision block 314 to step 320, a seek operation to the indicated physical address is performed on drive 0. The actuator for the unused drive, drive 1, may be moved by the seek distance toward the physical center of the track band, or to the physically center track, whichever distance is shorter. Moving the unused actuator toward a center position reduces the maximum possible seek distance for the unused actuator for the next read operation. Then, at step 322 the previous track address for drive 0 is updated. Drive 1 position is updated if centering is used. Following the YES branch from decision block 314 to step 316, a seek to the indicated physical address on drive 1 is performed. Drive 0 may be moved toward or to a physically centered position by the seek distance or less. Next, step 318 is performed to update the previous track address for the drives.

If three or more drives are used, drives not used for a read operation are not moved toward the physical center of the band tracks, but toward positions ⅓ and ⅔ of the distance through the band tracks. The "balanced" positions may be assigned to a particular drive based on relative distance. Similarly, where four drives are used, positions ¼, ½ and ¾ through the track band are used for balancing the actuator positions of the unused drives.

Following steps 322 or 318, step 324 is executed to determine if all logical addresses forming the request for access to a record have been read. If yes, the YES branch is followed to step 306 and out of the process. If no, the NO branch is followed back to step 308 for processing of the next logical address.

Normalized seek length statistics for various disk drive combinations have been simulated. For the simulation the disk drives were assumed to be synchronized. The statistics are represented in TABLE 1.

TABLE 1

| DRIVE OPERATION | SINGLE DRIVE | | | DUAL DRIVES | | |
| --- | --- | --- | --- | --- | --- | --- |
| | Ave. | Std. | Max. | Ave. | Std. | Max. |
| READ ONLY | 0.333 | 0.235 | 1.000 | 0.072 | 0.102 | 0.485 |
| WRITE ONLY | 0.333 | 0.235 | — | 0.333 | 0.235 | — |

Ave. means average time to access. STD. is the standard deviation in time to access over a sample set. Max. means, maximum time to access for write operations. For the dual drive case 20,000 simulated seeks to randomly selected tracts were done. Average seek length was reduced from ⅓ of the databand to about 7% of the band. Variation in average seek length was reduced by over half. The maximum observed seek time of 0.485 represents an average for the two drives which were 0.489 and 0.479. The drives began the simulation synchronized. Centering of the unused drive was not done.

Pseudo-randomization of arm positions relative to logical tracks also seems to confer some benefits, even where no differences occur in track disposition between drives. Such a system may be achieved by allowing only one drive to respond to a seek after a synchronizing event (such as a write operation) and where the predicted seek times match. By allowing only one drive to respond to a seek at a time the arms will tend to reside in radially differentiated positions relative to logically (and here physically) corresponding tracks.

While the invention has been particularly shown and described with reference to a preferred embodiment, it will be understood by those skilled in the art that various changes in form and detail may be made therein without departing from the spirit and scope of the invention.

What is claimed is:

1. A secondary data storage system, comprising:

a plurality of direct access storage devices having rotating media for recording data;

means for assigning one logical address to a different location on each of the direct access storage devices, where the different locations have different radial displacement from an axis of rotation for the rotating media in each of the direct access storage devices; and means for mirroring a record on the direct access storage devices by writing instances of the record to each different location corresponding to a logical address.

2. A secondary data storage system as set forth in claim 1, and further comprising for each direct access storage device:

a transducer for reading data from and writing data to the rotating media;

an arm for positioning the transducer at a selected radial displacement from the axis of rotation for the rotating media; and means responsive to a exogenous request to read a record for determining the relative radial location for each arm respective to the radial displacement of the location where the record is written.

3. A secondary data storage system as set forth in claim 2, and further comprising:

means responsive to an exogenous request to read a record for selecting a transducer having the arm that is radially closest to the location of the record.

4. A secondary data storage system as set forth in claim 3, and further comprising:

means for positionally balancing the arms for transducers not used in responding to the exogenous request to read a record.

5. A secondary data storage system as set forth in claim 2, and further comprising:

first and second direct access storage devices;

the first and second direct access storage devices being substantially identical; and the radial displacement between different locations being one half the width of a band of tracks on the rotating media.

6. A secondary data storage system as set forth in claim 2, and further comprising:

first, second and third direct access storage devices;

the first, second and third direct access storage devices being substantially identical; and a radial displacement between different locations of one third the width of a band of tracks wherein the different locations occur, on the rotating media.

7. A data processing system, comprising:

main storage;

a central processing unit for processing data stored in main storage;

a plurality of mirrored disk drives for long term storage of duplicate copies of a plurality of data records;

a logical address for each data record; and a map of radially differentiated location from each mirrored disk drive to each logical address.

8. A data processing system as set forth in claim 7, and further comprising:

the mirrored disk drives each having a transducer for reading and writing to each mirrored disk drive; and a controller including, means responsive to an exogenous request for access to a data record stored on the mirrored disk drives for determining if the request for access is a read operation;

means responsive to a read request for determining a radial distance between each transducer and a duplicate copy of the data record for each mirrored disk drive; and means for conducting the read operation on the disk drive where the radial distance is smallest.

9. A data processing system as set forth in claim 8, the controller further including:

means for positionally balancing actuators for the disk drives not used for a read operation during the read operation.

10. A data processing system as set forth in claim 8, and further comprising:

first and second mirrored disk drives having corresponding circumferential tracks located in a band; and the radially displaced locations being located respectively in different halves of the band of tracks for each disk drive.

11. A data processing system as set forth in claim 8, wherein data is recorded using zone bit recording.

12. A data processing system as set forth in claim 8, and further comprising:

first, second and third mirrored disk drives each having circumferential tracks on rotating media;

an outermost third of the tracks on the first mirrored disk drive corresponding, respectively, to a middle third of the tracks on the second mirrored disk drive and an innermost third of the tracks on the third disk drive for radially differentiated locations corresponding to a logical address;

a middle third of the tracks on the first mirrored disk drive corresponding, respectively, to an inner third of the tracks on the second mirrored disk drive and an outermost third of the tracks on the third disk drive for radially differentiated locations corresponding to a logical address; and an inner third of the tracks on the first mirrored disk drive corresponding, logically, to an outer third of the tracks on the second mirrored disk drive and a middle third of the tracks on the third disk drive for radially differentiated locations corresponding to a logical address.

13. A method of storing and recovering data on a plurality of substantially similar disk drives, the method comprising the steps of:

recording a copy of a data record to tracks on each of the disk drives where the tracks have different spacings from an axis of rotation of each disk drive;

tracking the track location of an arm for each disk drive;

responsive to a read operation or a record, calculating, for each disk drive, the distance between the arm for the disk drive and the track on which the copy is located; and performing a seek operation to the copy on the disk drive for which the smallest distance was calculated.

14. The method of claim 13, and further comprising:

the step of recording a copy of a data record including spacing the complete copy by one half the total number of tracks between a location a first disk drive and a location on a second disk drive.

15. The method of claim 13, and further comprising:

the step of recording a copy of data record including selecting locations relatively spaced for each of three disk drives.

16. The method of claim 13, and further comprising the step of:

positionally balancing actuators for the disk drives unused during a read operation.

17. A secondary data storage system, comprising:

a plurality of disk drives, each disk drive having disks on which identical data is stored along a plurality of concentric tracks about an axis of rotation and an access arms for positioning a read transducer over a selected track;

means responsive to an access request to data for determining a seek time for access of data by the access arm for each disk drive; and means for accessing the data on a single disk drive, utilizing the disk drive having a shortest seek time, if any.

18. A secondary data storage system as set forth in claim 17, and further comprising:

the tracks on each disk drive having logical correspondence to one another, with logically corresponding tracks being differentially radially spaced from the axes of rotation of the disk drives.

* * * * *